United States Patent
Igarashi

(10) Patent No.: US 6,524,933 B2
(45) Date of Patent: Feb. 25, 2003

(54) METHODS OF MANUFACTURING SEMICONDUCTOR DEVICES THAT PROTECT INTERCONNECT WIRINGS DURING PROCESSING OF BACK SUBSTRATE SURFACE

(75) Inventor: Tadashi Igarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/866,815

(22) Filed: May 30, 2001

(65) Prior Publication Data

US 2002/0081831 A1 Jun. 27, 2002

(30) Foreign Application Priority Data

Dec. 27, 2000 (JP) .......................... 2000-397815

(51) Int. Cl.[7] .......................................... H01L 21/4763
(52) U.S. Cl. ...................... 438/459; 438/618; 438/780; 438/926
(58) Field of Search ................. 438/618, 619, 438/459, 460, 464, 926, 758, 759, 780, 622, 638

(56) References Cited

U.S. PATENT DOCUMENTS

| 5,656,552 A | * | 8/1997 | Hudak et al. ................. 438/15 |
| 6,017,822 A | * | 1/2000 | Mountain .................... 438/692 |
| 6,025,226 A | * | 2/2000 | Gambino et al. ........... 438/244 |
| 6,057,224 A | * | 5/2000 | Bothra et al. ............... 438/619 |
| 6,093,577 A | * | 7/2000 | van der Groen et al. ..... 438/30 |
| 6,146,992 A | * | 11/2000 | Lauterbach et al. ........ 438/623 |
| 6,180,527 B1 | * | 1/2001 | Farnworth et al. .......... 438/693 |
| 6,263,566 B1 | * | 7/2001 | Hembree et al. ............. 29/874 |
| 6,319,818 B1 | * | 11/2001 | Stamper ..................... 438/631 |

FOREIGN PATENT DOCUMENTS

JP 61-232625 A * 10/1986 ......... H01L/21/304

* cited by examiner

Primary Examiner—Olik Chaudhuri
Assistant Examiner—Stephen W. Smoot
(74) Attorney, Agent, or Firm—Volentine Francos, PLLC

(57) ABSTRACT

A method of manufacturing a semiconductor device, which is capable of reducing or preventing damage of wirings formed over a semiconductor substrate. The method of manufacturing the semiconductor device includes forming a wiring on the surface of a semiconductor substrate with a predetermined circuit formed thereon, forming a resin layer whose surface is substantially flat on the wiring, and processing the back of the semiconductor substrate after the formation of the resin layer.

7 Claims, 10 Drawing Sheets

METHODS OF MANUFACTURING SEMICONDUCTOR DEVICES THAT PROTECT INTERCONNECT WIRINGS DURING PROCESSING OF BACK SUBSTRATE SURFACE

BACKGROUND OF THE INVENTION

1. Field of the Invention

The present invention relates to a method of manufacturing a semiconductor device, and more specifically to a method of manufacturing a semiconductor device, wherein wirings or interconnections are formed on the surface of a semiconductor substrate with a predetermined circuit formed thereon and the back of the semiconductor substrate is thereafter processed.

2. Description of the Related Art

A method of manufacturing a semiconductor device with a conventional multilayer interconnection formed thereon will be explained based on FIG. 1.

As shown in FIG. 1(a), a lower interconnection or wiring 802 is formed on a semiconductor substrate 800 with a predetermined circuit formed thereon, by a vapor deposition method or a plating method or the like, for example. Next, as shown in FIG. 1(b), an insulating film 804 is formed on the lower wiring 802 and a contact hole 806 is thereafter defined in an area which contacts an upper interconnection or wiring, by a photolithography method and an etching method, for example. As shown in FIG. 1(c), an upper wiring 808 is further formed on the insulating film 804 and within the contact hole 806 by the vapor deposition method or plating method or the like, for example and electrically connected to the lower wiring 802.

Next, a protective film or coat 810 is formed over the upper wiring 808 as shown in FIG. 1(d). Thereafter, the back of the semiconductor substrate 800 is polished or ground to set it to a desired assembly thickness, followed by deposition of a metal 812, for example.

In recent years, there may be cases in which a multilayer interconnection having a so-called air bridge structure is used to reduce a parasitic capacitance developed with an increase in frequency as shown in FIG. 2. In such an air bridge structure, a cavity 904 is defined without interposing an insulating film between a lower wiring 902 and an upper wiring 906 when a compound semiconductor substrate is used as a semiconductor substrate 900.

SUMMARY OF THE INVENTION

However, the conventional structure has a problem in that since the surface of a semiconductor substrate must be held in a step for polishing and grinding the back or reverse side of the semiconductor substrate and a step for metal-depositing the back thereof, for example, an upper interconnection or wiring will deform due to an external force or break. A problem arises in that since cavitation is made between an upper wiring and a lower wiring in the case of a semiconductor device having the air bridge structure in particular, the strength of the semiconductor device against an external force is low and a manufacturing yield of the semiconductor device is reduced.

Accordingly, an object of the present invention is to provide a novel and improved method of manufacturing a semiconductor device, which is capable of reducing or preventing damage of a wiring formed over a semiconductor substrate.

In order to solve the above problems, the invention provides a method of manufacturing a semiconductor device, comprising a step for forming a wiring on the surface of a semiconductor substrate with a predetermined circuit formed thereon, a step for forming a resin layer having a substantially flat surface on the wiring, and a step for processing the back of the semiconductor substrate after the formation of the resin layer.

In the invention as noted above, since a substantially flat resin layer is formed on the surface of a semiconductor substrate, which has wiring irregularities, an external force applied to the surface of the semiconductor substrate in a step for processing the back of the semiconductor substrate can be dispersed over a wide range. As a result, for example, distortion and breaking of the (upper) wiring or interconnection can be reduced and a manufacturing yield is enhanced.

In order to solve the above problems, the invention also provides a method of manufacturing a semiconductor device, comprising a step for forming a wiring on the surface of a semiconductor substrate with a predetermined circuit formed thereon, a step for forming a resin wall higher than at least the wiring and substantially uniform in height on the periphery of the surface of the semiconductor substrate, and a step for processing the back of the semiconductor substrate after the formation of the resin wall.

In the invention as described above, an external force applied to the surface of a semiconductor substrate in a step for processing the back of the semiconductor substrate can be distributed to a resin wall formed on the periphery of the semiconductor substrate. As a result, for example, distortion and breaking of the (upper) wiring or interconnection can be reduced and a manufacturing yield is enhanced.

In order to solve the above problems, if the resin wall is configured so as to be formed along cutting lines of the semiconductor substrate, then no external force is applied to an (upper) wiring in a step for processing the back of the semiconductor substrate.

In order to solve the above problems, the invention further provides a method of manufacturing a semiconductor device, comprising a step for forming a lower wiring and an upper wiring which intersect each other, on the surface of a semiconductor substrate with a predetermined circuit formed thereon, a step for forming resin posts higher than the height of an intersecting portion of the lower and upper wirings and substantially uniform in height in the neighborhood of each individual intersecting portions of areas partitioned according to the intersection of the wirings after the formation of the lower and upper wirings, and a step for processing the back of the semiconductor substrate after the formation of the resin posts.

In the invention as described above, since an external force applied to the surface of a semiconductor substrate in a step for processing the back of the semiconductor substrate is distributed to resin posts, the external force applied to an upper wiring can be reduced. As a result, for example, distortion and breaking of the upper wiring can be reduced and a manufacturing yield is enhanced.

In order to solve the above problems, the resin wall may preferably be comprised of a polyimide resin.

In order to solve the above problems, the invention also provides a method of manufacturing a semiconductor device wherein a lower wiring and an upper wiring intersecting each other are formed on the surface of a semiconductor substrate with a predetermined circuit formed thereon, comprising forming protrusions each having the same structure as an intersecting portion of the lower and upper wirings in the neighborhood of each individual intersecting portions of areas partitioned by the wiring intersection portion thereof, according to a step identical to a step for forming the intersecting portion of the lower and upper wirings.

In the invention as described above, since columnar dummy patterns each obtained by laminating a metal and an insulating film are formed in the neighborhood of an intersecting portion of an upper wiring and a lower wiring, an external force applied to the surface of a semiconductor substrate in a step for processing the back of the semiconductor substrate can be distributed to the dummy patterns. As a result, distortion and breaking of the upper wiring used as an actual circuit can be reduced and a manufacturing yield is enhanced.

In the invention as described, for solving the above problems, the semiconductor device manufacturing method further has a step for pre-processing the semiconductor substrate so that an area for forming each protrusion becomes higher than other areas. If the protrusion is configured so as to be shaped in form higher than the wiring intersecting portion in height, then columnar dummy patterns each obtained by laminating a metal and an insulating film are formed in the neighborhood of an intersecting portion of an upper wiring and a lower wiring so as to become higher than the intersecting portion. Therefore, an external force applied to the surface of the semiconductor substrate in a step for processing the back of the semiconductor substrate can effectively be distributed to dummy patterns. As a result, distortion and breaking of the upper wiring used as an actual circuit can be reduced and a manufacturing yield is enhanced.

In order to solve the above problems, the invention as further described provides a method of manufacturing a semiconductor device in which a lower wiring and an upper wiring intersecting each other are formed on the surface of a semiconductor substrate with a predetermined circuit formed thereon, comprising a step for defining a substantially concave trench having a predetermined depth in an area for forming the lower wiring, which is placed on the surface of the semiconductor substrate, a step for forming the lower wiring in a lower wiring forming area including the inside of the substantially concave trench, a step for forming a substantially flat upper wiring on the surface of the semiconductor substrate so as to pass over the lower wiring at an intersecting portion of the lower and upper wirings, and a step for processing the back of the semiconductor substrate.

Since an upper wiring is formed flatly in the invention as described above, an external force applied to the surface of a semiconductor substrate in a step for processing the back of the semiconductor substrate can be dispersed over the entire upper wiring. As a result, distortion and breaking of the upper wiring can be reduced and a manufacturing yield is enhanced.

In order to solve the above problems, the invention as further described provides a method of manufacturing a semiconductor device in which a lower wiring and an upper wiring intersecting each other are formed on the surface of a semiconductor substrate with a predetermined circuit formed thereon, comprising a step for defining a substantially concave trench having a predetermined depth in an area for forming the lower wiring, which is placed on the surface of the semiconductor substrate, a step for forming the lower wiring in a lower wiring forming area including the inside of the substantially concave trench, a step for forming a substantially flat upper wiring on the surface of the semiconductor substrate so as to have a recessed shape within the substantially concave trench at an intersecting portion of the lower and upper wirings, and a step for processing the back of the semiconductor substrate.

In the invention described above, since an upper wiring is shaped in concave form at an intersecting portion of the upper wiring and a lower wring, no external force is applied to the intersecting portion of the upper and lower wirings in a step for processing the back of the semiconductor substrate. As a result, for example, distortion and breaking of the upper wiring can be reduced and a manufacturing yield is enhanced.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1A:
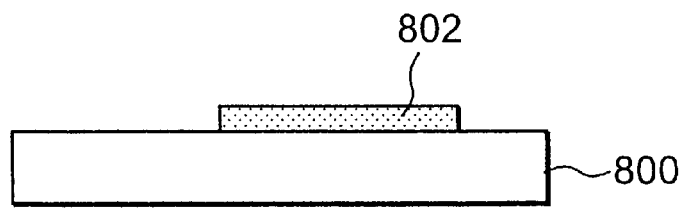
FIG. 1 is a sectional process view for describing a conventional method of manufacturing a semiconductor device.
Figure 1B:
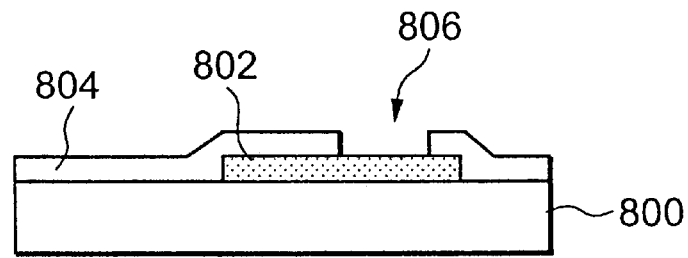
Figure 1C:
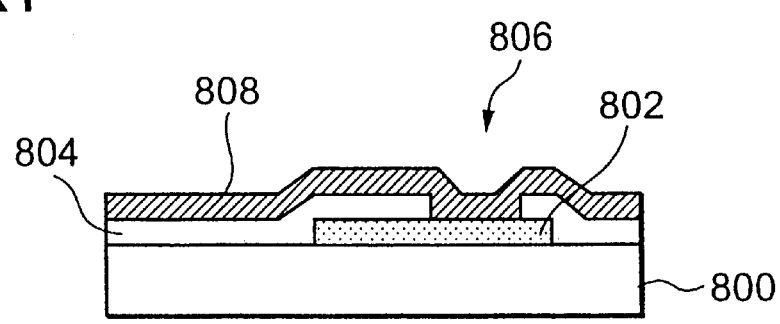
Figure 1D:
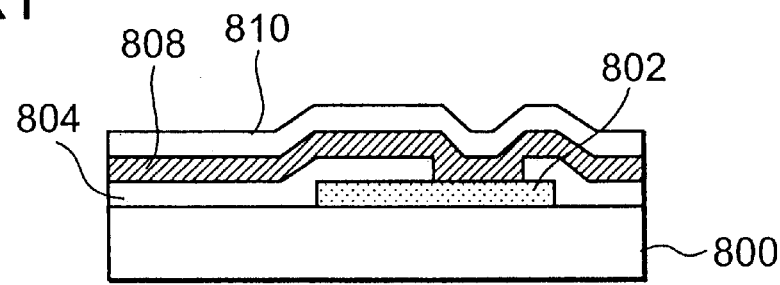
Figure 1E:
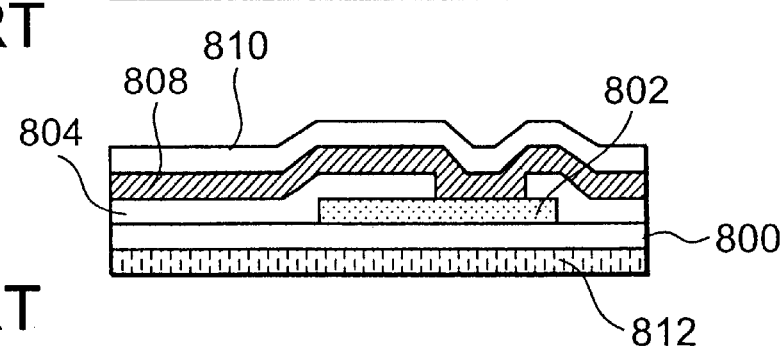
Figure 2:
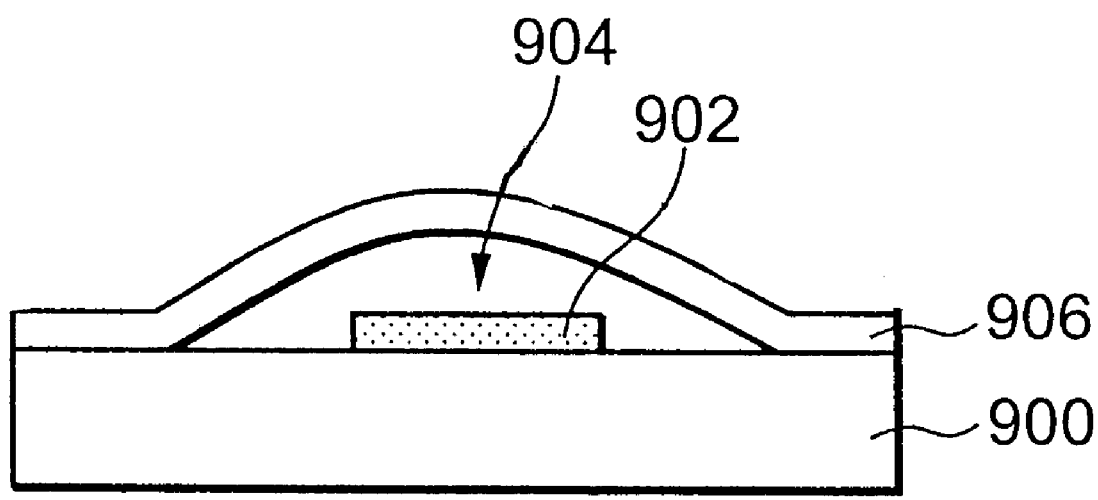
FIG. 2 is a sectional view for describing a conventional air conventional bridge structure of a semiconductor device.

Preferred embodiments of the present invention will hereinafter be described in detail with reference to the accompanying drawings. Incidentally, the same elements of structure, which have the same functions and configurations in the following description and accompanying drawings, are identified by the same reference numerals, and the description of certain common elements will therefore be omitted.

(First Embodiment)

A first embodiment will first be described with reference to FIG. 3. Incidentally, FIG. 3 is a sectional process view for describing a method of manufacturing a semiconductor device, according to the present embodiment.

Figure 3A:
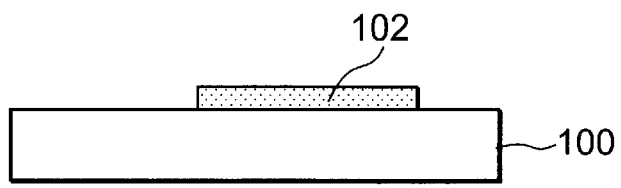
FIG. 3 is a sectional process view for describing a method of manufacturing a semiconductor device, according to a first embodiment.
Figure 3B:
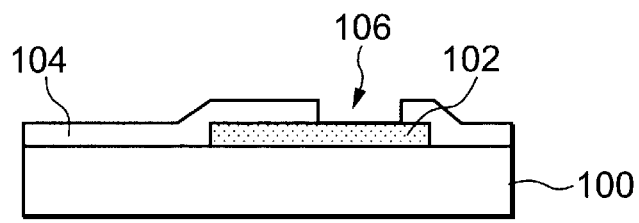
Figure 3C:
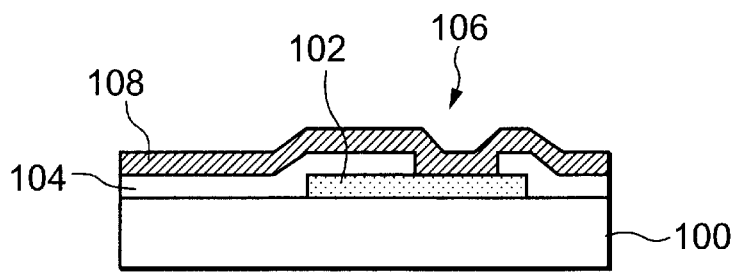
Figure 3D:
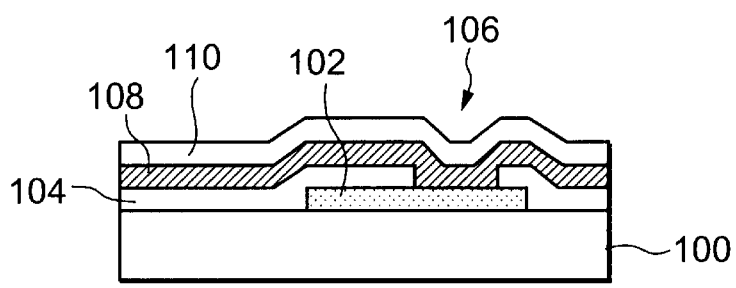

As shown in FIG. 3(a), a lower interconnection or wiring 102 is first formed in a predetermined area lying on a semiconductor substrate 100 having a predetermined circuit formed thereon, by a vapor deposition method or a plating method or the like, for example. Next, an insulating film 104 is formed on the lower wiring 102 as shown in FIG. 3(b). Thereafter, a contact hole 106 is defined in an area which contacts an upper interconnection or wiring, by a photolithography method and an etching method. Further, the upper wiring 108 is formed on the insulating film 104 and within the contact hole 106 by, for example, the vapor deposition method or plating method and electrically connected to the lower wiring 102 as shown in FIG. 3(c). Next, a protective film or coat 110 is formed on the upper wiring 108 as shown in FIG. 3(d).

Figure 3E:
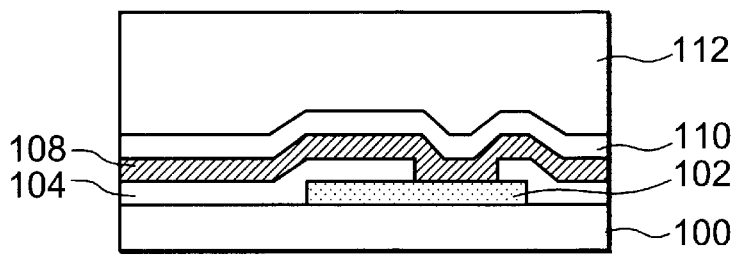

Thereafter, as shown in FIG. 3(e), a resin layer 112 comprised of polyimide or the like is further formed over the upper wiring 108 with the protective coat 110 formed thereon and the surface of the resin layer 112 is flattened in the present embodiment.

Since the resin layer whose surface is flat, is formed over the upper wiring in the present embodiment as distinct from the prior art, an external force applied to the surface of the semiconductor substrate in a step for processing or handling the back or reverse side of the semiconductor substrate can be dispersed over areas other than convex portions of the upper wiring, for example.

Figure 3F:
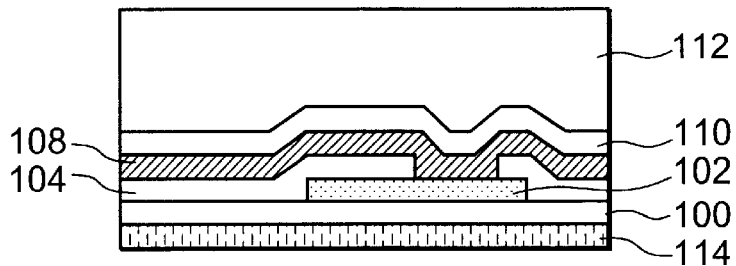

Thereafter, as shown in FIG. 3(f), a resin layer 112 comprised of polyimide or the like is further formed over the upper wiring 108 with the protective coat 110 formed thereon and the surface of the resin layer 112 is flattened in the present embodiment.

Incidentally, when the resin layer composed of polyimide or the like, which is applied onto the substrate surface, causes inconvenience in a subsequent process step or exerts an influence on the characteristics or reliability of the semiconductor device, a process step for vapor-depositing the metal on the back of the semiconductor substrate and thereafter selectively removing the resin layer can additionally be provided (not shown).

Since the resin layer whose surface is flat, is formed over the upper wiring in the present embodiment, the external force applied to the surface of the semiconductor substrate in the step for processing the back of the semiconductor, substrate can be dispersed over a wide range through the resin layer. As a result, distortion and breaking of the upper wiring, for example can be reduced and a manufacturing yield is enhanced.

(Second Embodiment)

The first embodiment has adopted the configuration wherein the resin such as polyimide, whose surface is flat, is formed on the surface of the semiconductor substrate by the application or coating method or the like. However, since the transfer of the external force applied to the resin layer to the upper wiring cannot fully be eliminated, the warpage and breaking of the upper wiring cannot completely be avoided. In the present embodiment, a resin wall comprised of, for example, polyimide or the like is formed on its corresponding outer peripheral portion of a semiconductor substrate or dicing lines thereof prior to the processing of the back of the semiconductor substrate.

Figure 4A:
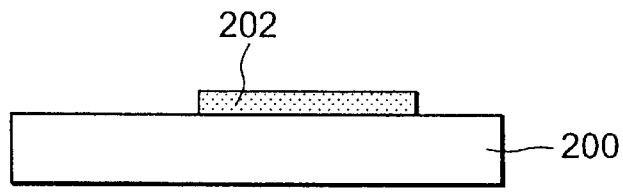
FIG. 4 is a sectional process view for describing a method of manufacturing a semiconductor device, according to a second embodiment.
Figure 4B:
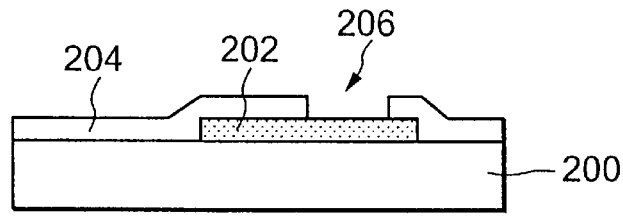
Figure 4C:
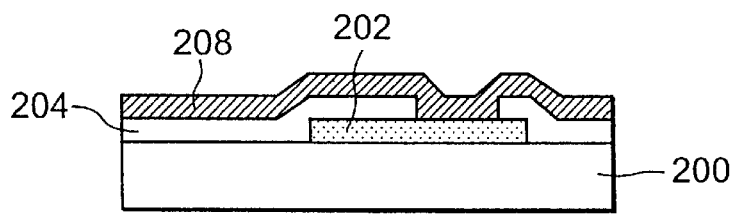
Figure 4D:
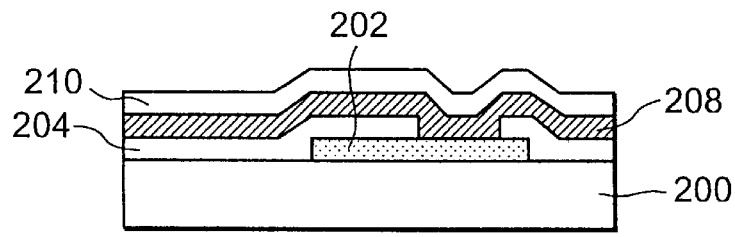

The second embodiment will be explained below with reference to FIGS. 4 and 5. Incidentally, FIG. 4 is a sectional process view for describing a method of manufacturing a semiconductor device, according to the present embodiment. Since process steps used up to FIG. 4(d) are similar to those used up to FIG. 3(d) in the first embodiment, their description will be omitted.

Figure 4E:
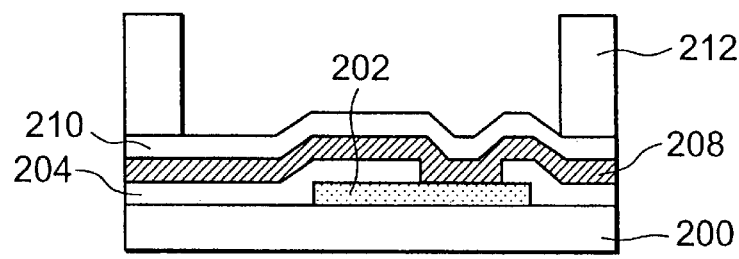

As shown in FIG. 4(e), a protective coat or film is first formed on an upper wiring. Thereafter, a resin wall 212 comprised of, for example, polyimide or the like is formed on its corresponding peripheral portion (e.g., along dicing lines) of a semiconductor substrate by a photography method and an etching method, for example.

Figure 5:
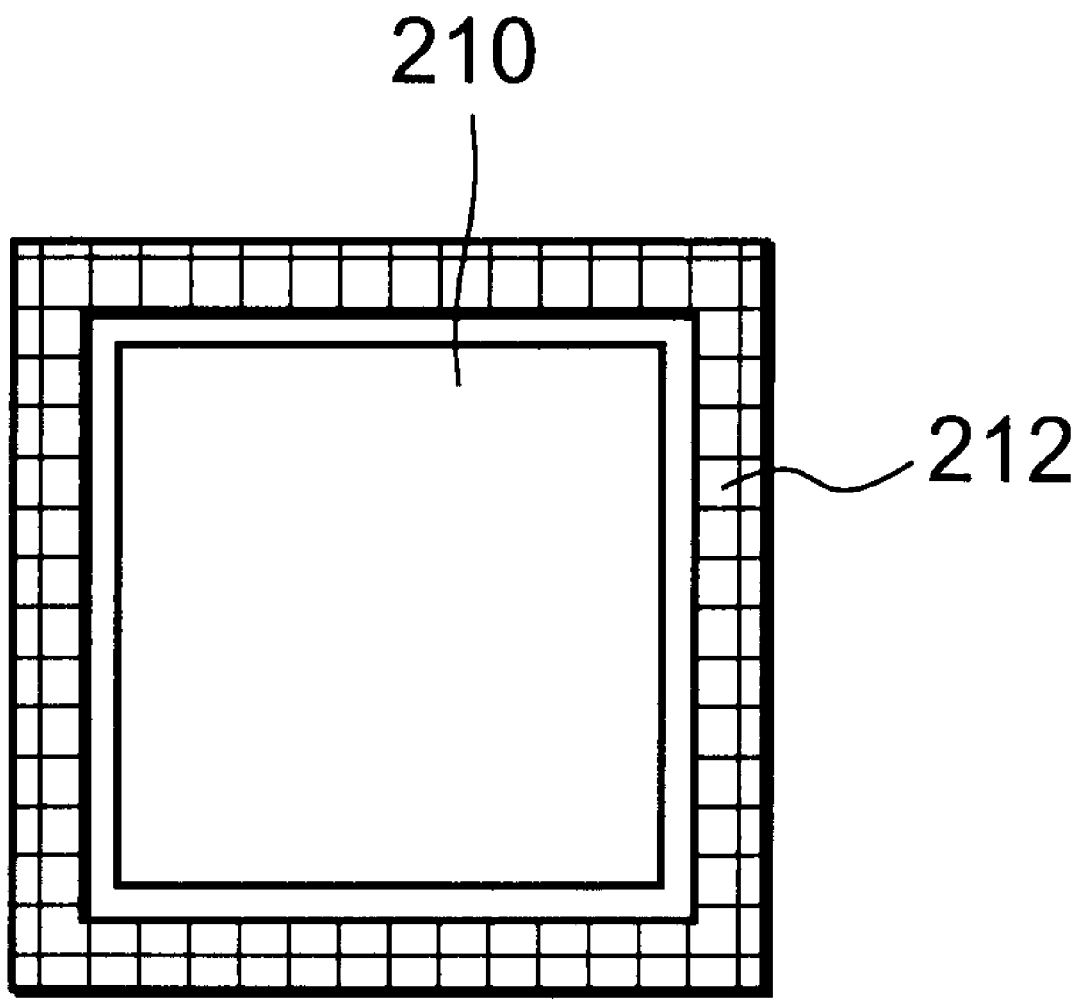
FIG. 5 is a top view for describing the method of manufacturing the semiconductor device, according to the second embodiment.

Since the resin wall 212 comprised of, for example, polyimide or the like is formed on its corresponding peripheral portion (e.g., along the dicing lines) as shown in FIG. 5, an external force applied to the surface of the semiconductor substrate in the step for processing the back of the semiconductor substrate can be distributed to the resin wall formed on the periphery of the semiconductor substrate.

Figure 4F:
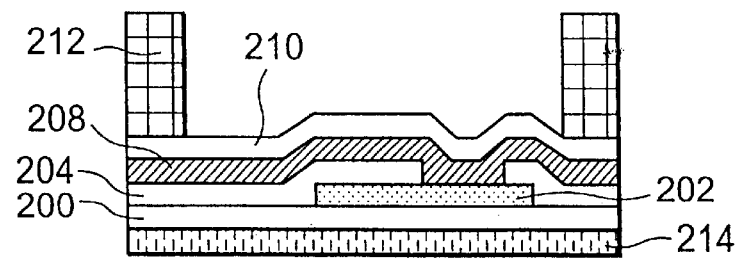

Thereafter, as shown in FIG. 4(f), the back of the semiconductor substrate is polished or ground to set it to a desired assembly thickness, followed by vapor deposition of a metal 214, for example.

Incidentally, when the resin wall composed of polyimide or the like, which is applied onto the substrate surface, causes inconvenience in a subsequent process step or exerts an influence on the characteristics or reliability of the semiconductor device, a process step for vapor-depositing the metal on the back of the semiconductor substrate and thereafter selectively removing the resin wall can additionally be provided (not shown).

Since the external force applied to the surface of the semiconductor substrate in the step for processing the back of the semiconductor substrate can be distributed to the resin wall formed on the periphery of the semiconductor substrate. As a result, distortion and breaking of the upper wiring, for example, can be reduced and a manufacturing yield is enhanced.

(Third Embodiment)

The second embodiment has adopted the configuration wherein the resin wall comprised of polyimide, for example, is formed on the peripheral portion of the semiconductor substrate or on the dicing lines. Since, however, the resin wall is formed away from a wiring intersecting portion which protrudes highest, there is a possibility that the wiring intersecting portion will make contact so as to undergo an external force. Therefore, a plurality of resin posts each comprised of polyimide or the like are formed in the neighborhood of a portion where an upper wiring intersects a lower wiring.

Figure 6A:
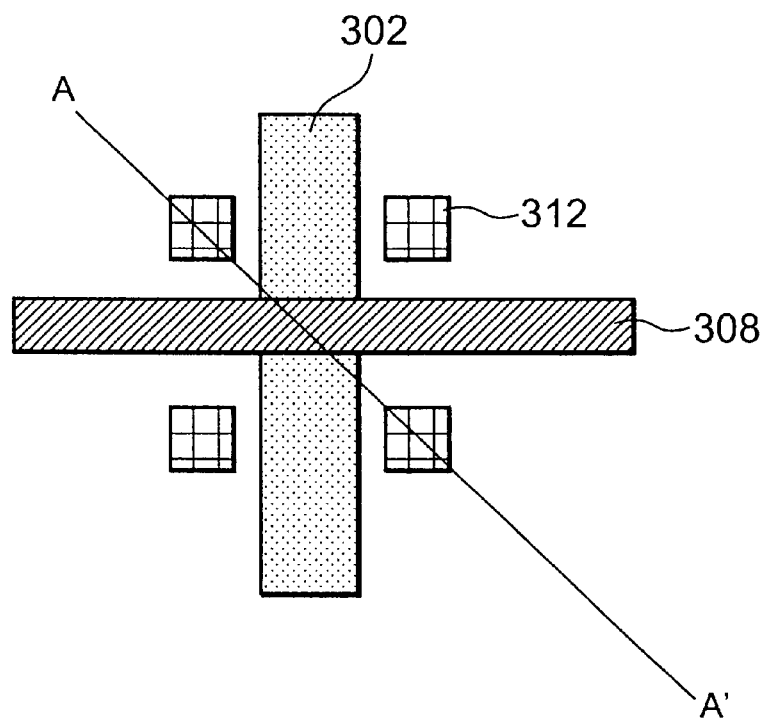
FIG. 6 is a view for describing a method of manufacturing a semiconductor device, according to a third embodiment.
Figure 6B:
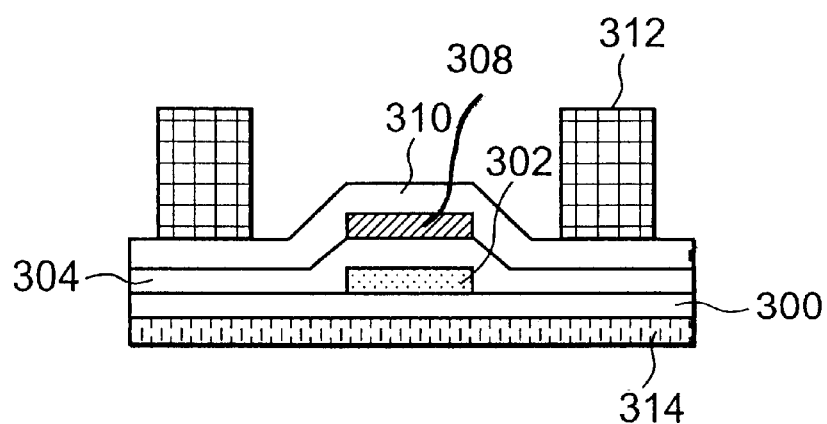

A third embodiment will be described below with reference to FIG. 6. Incidentally, FIG. 6 is a view for describing a method of manufacturing a semiconductor device, according to the present embodiment. Incidentally, since the process steps up to FIG. 3(d) employed in the first embodiment are similar in FIG. 6, their description will be omitted.

As shown in FIG. 6, a protective coat or film 310 is first formed on an upper wiring 308. In the present embodiment, resin posts 312 comprised of polyimide, for example, are thereafter formed in the neighborhood of each individual intersecting portions of four areas divided by an intersecting portion of a lower wiring 302 and the upper wiring 308 by a photography method and an etching method, for example. At this time, the resin posts each having a height higher than that of the protruding wiring intersecting portion are formed.

Since the external force is applied to the resin posts in a step for processing the back of the semiconductor substrate in the present embodiment, the external force applied to the upper wiring can be reduced.

Thereafter, the back of the semiconductor substrate is polished or ground to set it to a desired assembly thickness, followed by deposition of a metal 314, for example.

Incidentally, when the resin posts comprised of polyimide or the like, which are applied onto the substrate surface, cause inconvenience in a subsequent process step or exert an influence on the characteristics or reliability of the semiconductor device, a process step for vapor-depositing the metal on the back of the semiconductor substrate and thereafter selectively removing the resin posts can additionally be provided (not shown).

In the present embodiment, the external force applied to the surface of the semiconductor substrate in the step for processing the back of the semiconductor substrate can be distributed to the resin posts, and the external force applied to the upper wiring can be reduced. As a result, distortion and breaking of the upper wiring, for example, can be reduced and a manufacturing yield is enhanced.

(Fourth Embodiment)

In the third embodiment, the resin posts comprised of polyimide or the like have been formed in the neighborhood of the intersecting portion of the upper and lower wirings. It is however necessary to provide an additional process step for forming the resin posts. In the present embodiment, protrusions are formed in the neighborhood of an intersecting portion of an upper wiring and a lower wiring according to the same manufacturing process as, the prior art.

Figure 7A:
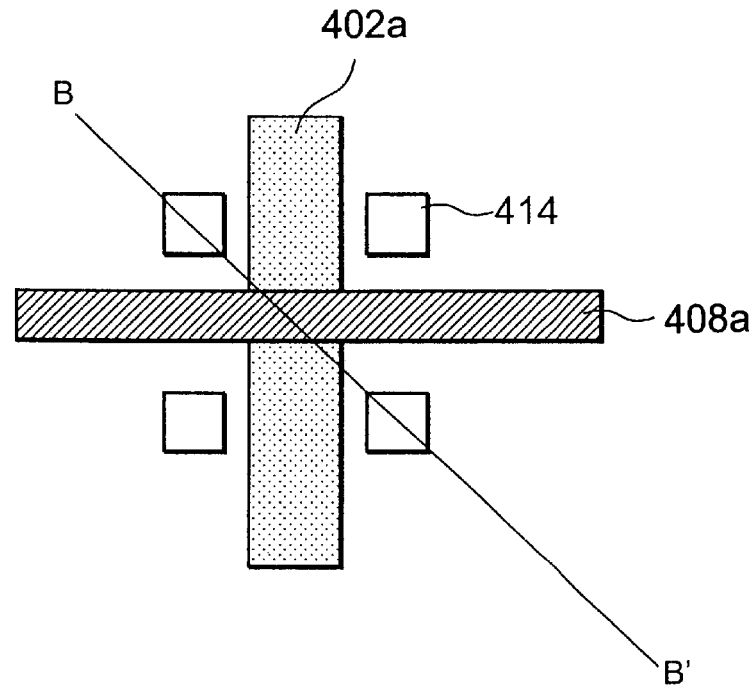
FIG. 7 is a view for describing a method of manufacturing a semiconductor device, according to a fourth embodiment.
Figure 7B:
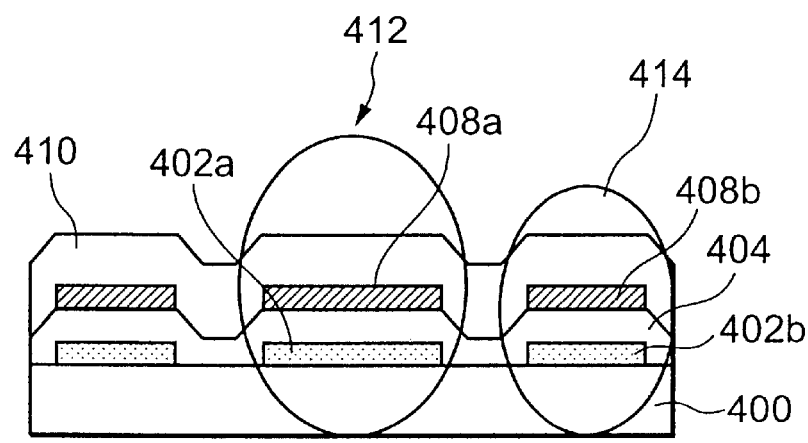

A fourth embodiment will be explained below with reference to FIG. 7. Incidentally, FIG. 7 is a view for describing a method of manufacturing a semiconductor device, according to the,present embodiment.

A lower wiring 402a is first formed in a predetermined area on a semiconductor substrate 400 with a predetermined circuit formed thereon by a vapor deposition method or a coating method or the like. At this time, a dummy lower wiring 402b is formed even in protrusion forming areas. The lower wiring 402a, 402b is formed using masking patters which allow the formation of the lower wiring even within the protrusion forming areas in addition to the normal lower wiring area, for example. Thus, the lower wiring 402b is formed in the protrusion forming areas in the same process as the normal process.

Next, an insulating film 404 is formed on the lower wiring 402a, 402b formed in the lower wiring area and protrusion forming areas. Thereafter, a contact hole is defined in its corresponding area which is provided on the insulating film 404 on the lower wiring 402a in the lower wiring area and contacts the upper wiring, by a photolithography method and an etching method.

Further, a vapor deposition method or a coating method or the like, for example is used to form an upper wiring 408a, 408b on the insulating film 404 in the upper wiring forming area and protrusion forming areas so as to fall within the contact hole. In the present embodiment as distinct from the prior art, an upper wiring 408a is formed in its corresponding upper wiring area, and a dummy upper wiring 408b is formed even in each protrusion forming area. The upper wiring 408a, 408b is formed using masking patterns which allow the formation of the upper wiring even within the protrusion forming areas in addition to the normal upper wiring area, for example. Thus, the upper wiring 408b is formed in the protrusion forming areas in the same process as the normal process. Incidentally, the formation of the upper wiring 408a within the contact hole allows an electrical connection of the upper wiring 408a and the lower wiring 402a.

Next, a protective coat or film 410 is formed over the entire surface of the semiconductor substrate with the upper wiring 408a, 408b formed thereon.

Thus, in the present embodiment, columnar dummy patterns (protrusions) 414 obtained by laminating the lower wiring 402b, the insulating film 404 and the upper wiring 408b are formed in the neighborhood of an intersecting portion 412 of the upper wiring 408a and the lower wiring 402a. Thus, an external force applied upon processing of the back of the semiconductor substrate can be distributed to the columnar dummy patterns (protrusions) 414.

Thereafter, the back of the semiconductor substrate is polished or ground to set it to a desired assembly thickness, followed by deposition of a metal, for example (not shown).

Since the columnar dummy patterns (protrusions) obtained by stacking the lower wiring, insulating film and upper wiring on one another are formed in the neighborhood of the intersecting portion of the upper and lower wirings without additionally providing a resin forming process step in the present embodiment, the external force applied upon handling of the back of the semiconductor substrate can be distributed to the columnar dummy patterns (protrusions). As a result, distortion and breaking of the upper wiring used as an actual circuit can be reduced and a manufacturing yield is enhanced.

(Fifth Embodiment)

The fourth embodiment has adopted the configuration wherein the columnar dummy patterns (protrusions) obtained by laminating the metal and insulating film are formed in the neighborhood of the intersecting portion of the upper and lower wirings. However, only the columnar dummy patterns each substantially identical in height to the intersecting portion of the upper and lower wirings are formed. Therefore, the external force is applied even to the intersecting portion to no small extent. Particularly when an air bridge structure is adopted, a problem arises in that the height of an intersecting portion becomes higher than that of each dummy pattern post. The present embodiment adopts a configuration in which a substrate portion other than the neighborhood of an intersecting portion of an upper wiring and a lower wiring is removed in advance by etching.

Figure 8:
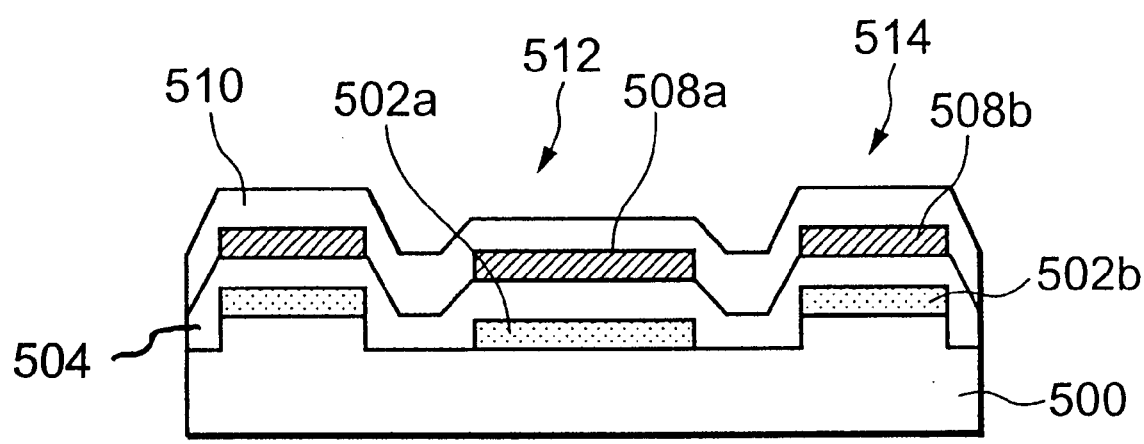
FIG. 8 is a sectional view for describing a method of manufacturing a semiconductor device, according to a fifth embodiment.

A fifth embodiment will be explained below with reference to FIG. 8. Incidentally, FIG. 8 is a cross-sectional view for describing a method of manufacturing a semiconductor device, according to the present embodiment.

In a semiconductor substrate 500, areas other than each protrusion forming area 514 in the vicinity of an intersecting portion 512 of an upper wiring 508a and a lower wiring 502a are removed in advance by a photolithography method and an etching method, for example. Thus, the protrusion forming area 514 of the semiconductor substrate 500 is formed so as to become higher than other areas in height. Next, the lower wiring 502a, 502b, an insulating layer 504, the upper wiring 508a, 508b and a protective film or coat 510 are successively formed according to a process step similar to the fourth embodiment.

Thereafter, the back of the semiconductor substrate 500 is polished or ground:to set it to a desired assembly thickness, followed by deposition of a metal, for example (not shown).

Since each columnar dummy pattern (protrusion) 514 obtained by laminating a lower wiring 502b, the insulating film 504 and an upper wiring 508b is formed in the neighborhood of the intersecting portion 512 of the upper wiring 508a and the lower wiring 502a without additionally providing a resin forming process step, so as to becomes higher than the intersecting portion 512 in the present embodiment, the external force applied upon handling of the back of the semiconductor substrate can be distributed to the columnar dummy pattern (protrusion) 514. As a result, distortion and breaking of the upper wiring used as an actual circuit can be reduced and a manufacturing yield is enhanced.

(Sixth Embodiment)

The above-described embodiment has adopted the configuration wherein the external force applied to the upper wiring is distributed to the patterns which protrude from the upper wiring. However, the present embodiment adopts a configuration in which a lower wiring is embedded in a trench defined in a semiconductor substrate and an external force is dispersed without providing protrusions.

A sixth embodiment will be explained below with reference to FIG. 9. Incidentally, FIG. 9 is a sectional process view for describing a method of manufacturing a semiconductor device, according to the present embodiment.

Figure 9A:
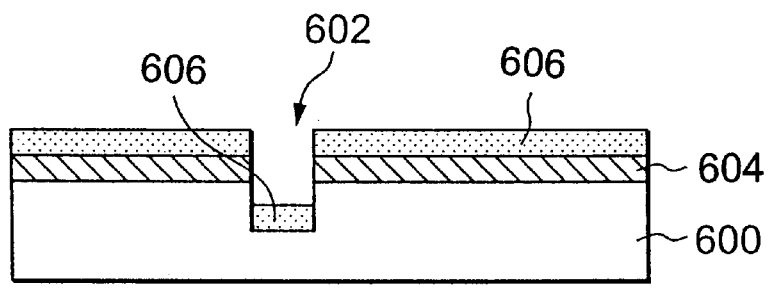
FIG. 9 is a sectional process view for describing a method of manufacturing a semiconductor device, according to a sixth embodiment.

As shown in FIG. 9(a), a lower wiring forming area on a semiconductor substrate 600 with a predetermined circuit formed thereon is removed by, for example, a photolithography method and an etching method to thereby form a trench 602. Next, an insulating film 604 is formed on the semiconductor substrate 600 with the trench 602 defined therein. Further, a lower wiring 606 is formed by a vapor deposition method or a plating method or the like, for example. At this time, the lower wiring 606 is formed even in the trench 602 of the semiconductor substrate 600.

Figure 9B:
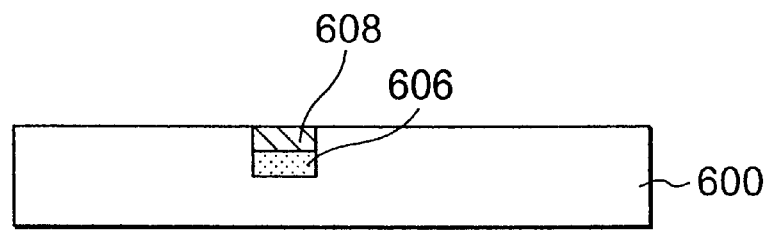
Figure 9C:
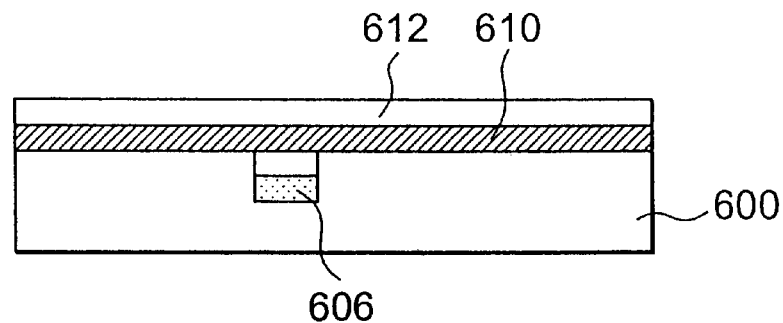

Thereafter, a resist film 608 is formed by a method of application, for example, as shown in FIG. 9(b). Further, an upper wiring 610 is formed by a vapor deposition method or a plating method, for example, as shown in FIG. 9(c). Afterwards, a protective film or coat 612 is further formed.

Thereafter, the back of the semiconductor substrate is polished or ground to set it to a desired assembly thickness, followed by deposition of a metal, for example (not shown).

Since the upper wiring is formed in a flat manner, the external force applied to the surface of the semiconductor substrate in the step for processing the back of the semiconductor substrate can be dispersed over the entire upper wiring. As a result, distortion and breaking of the upper wiring can be reduced and a manufacturing yield can be enhanced.

(Seventh Embodiment)

The sixth embodiment is configured so that the upper wiring becomes flat. However, when a gap is defined at an intersecting portion of an upper wiring and a lower wiring as in the case of an air bridge structure or the like, for example, a problem arises in that the intersecting portion is easy to deform due to an external force. The present embodiment adopts a configuration wherein an upper wiring is formed after a resist for the intersecting portion is thinned.

A seventh embodiment will be explained below with reference to FIG. 10. Incidentally, FIG. 10 is a sectional process view for describing a method of manufacturing a semiconductor device, according to the present embodiment.

Figure 10A:
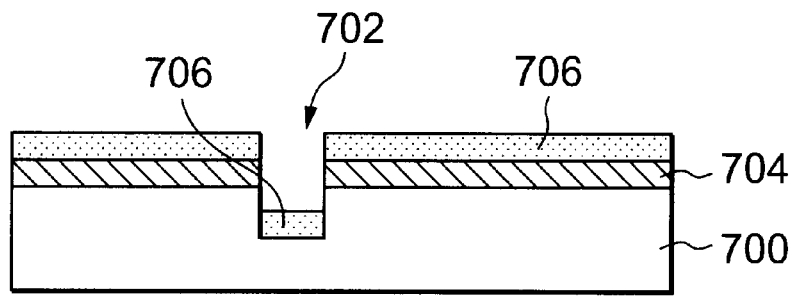
FIG. 10 is a sectional process view for describing a method of manufacturing a semiconductor device, according to a seventh embodiment.

As shown in FIG. 10(a), a lower wiring forming area on a semiconductor substrate 700 with a predetermined circuit formed thereon is removed by, for example, a photolithography method and an etching method to thereby form a trench 702.

Next, an insulating film 704 is formed on the semiconductor substrate 700 with the trench 702 defined therein. Further, a lower, wiring 706 is formed by a vapor deposition method or a plating method or the like, for example. At this time, the lower wiring 706 is formed even in the trench 702 of the semiconductor substrate 700.

Figure 10B:
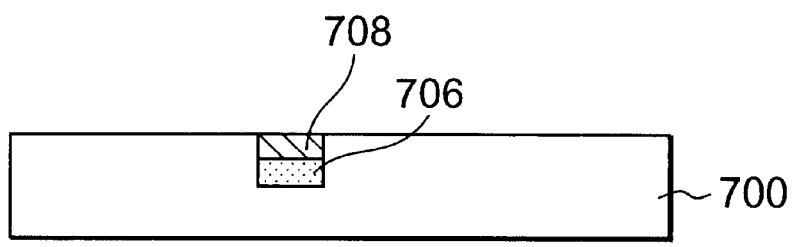
Figure 10C:
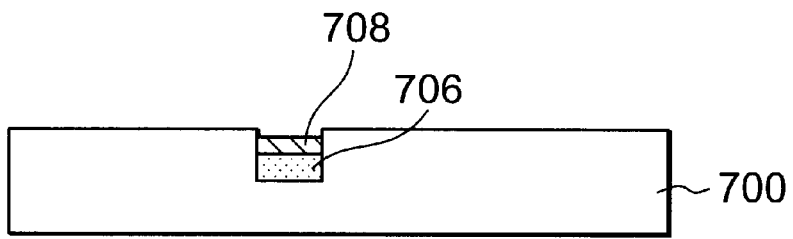

Thereafter, a resist film 708 is formed by a method of application, for example, as shown in FIG. 10(b). Further, as shown in FIG. 10(c), the surface of the resist film 708 is removed and formed thin by, for example, an ashing method or the like as distinct from the sixth embodiment.

Figure 10D:
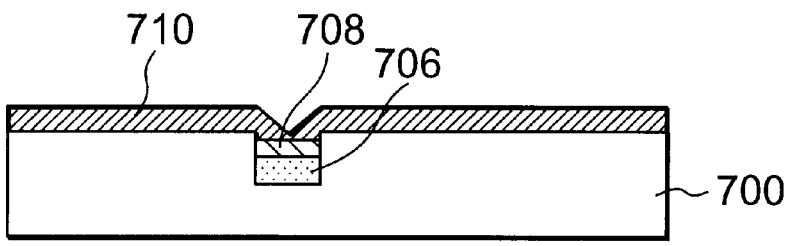
Figure 10E:
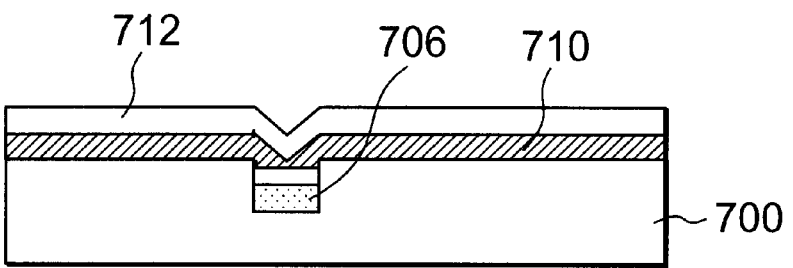

Next, an upper wiring 710 is formed by the vapor deposition method or plating method or the like, for example, as shown in FIG. 10(d). Since, at this time, the resist film 708 is formed thin, the upper wiring 710 is formed so as to recess at an intersecting portion (trench) 702. Thereafter, a protective film or coat 712 is formed as shown in FIG. 10(e).

Afterwards, the back of the semiconductor substrate is polished or ground to set it to a desired assembly thickness, followed by deposition of a metal, for example (not shown).

Since the upper wiring is shaped in concave form at the portion which intersects the lower wiring in the present embodiment, no external force is applied to the intersecting portion of the upper and lower wirings in the step for processing the back of the semiconductor substrate. As a result, distortion and breaking of the upper wiring, for example, can be reduced and a manufacturing yield is enhanced.

While the preferred embodiments according to the present invention have been described above, the present invention is not limited to such configurations. It will be apparent to those skilled in the art that various modifications and changes can be supposed to be made to the invention within the scope of a technical idea described in the following claims. It is understood that those modifications and changes also fall within the technical scope of the present invention.

While, for example, the first and second embodiments have been described by citing the example of the configuration having adopted the multilayer interconnection, the present invention can be implemented even in the case of a single layer interconnection or wiring.

While the aforementioned embodiments have been described by citing the example of the configuration having adopted the multilayer interconnection comprised of the two layers, the present invention can be implemented even in the case of interconnections or wirings of three layers or more.

What is claimed is:

1. A method of manufacturing a semiconductor device, comprising: forming a wiring on a front surface of a semiconductor substrate with a predetermined circuit formed thereon;

forming a resin wall higher than at least said wiring and substantially uniform in height on a periphery of the front surface of the semiconductor substrate; and processing a back surface of the semiconductor substrate after said forming a resin wall.

2. The method according to claim 1, wherein said resin wall is formed on cutting lines of the semiconductor substrate.

3. A method of manufacturing a semiconductor device, comprising:

forming a lower wiring and an upper wiring which intersect each other, on a front surface of a semiconductor substrate with a predetermined circuit formed thereon;

forming resin posts higher than a height of an intersecting portion of the lower and upper wirings and substantially uniform in height in a neighborhood of areas partitioned by said intersecting-portion of said wirings after said forming a lower wiring and an upper wiring; and processing a back surface of the semiconductor substrate after said forming resin posts.

4. A method of manufacturing a semiconductor device wherein a lower wiring and an upper wiring intersecting each other are formed on a surface of a semiconductor substrate with a predetermined circuit formed thereon, comprising:

forming protrusions each having a same structure as an intersecting portion of the lower and upper wirings in a neighborhood of areas partitioned by said intersecting portion thereof, in an identical manner as forming of the intersecting portion of the lower and upper wirings; and processing a back surface of the semiconductor substrate after said forming protrusions.

5. The method according to claim 4, further including pre-processing the semiconductor substrate so that areas where the protrusions are to be formed become higher than other areas, and wherein the protrusions are formed so as to be higher than said wiring intersecting portion.

6. A method of manufacturing a semiconductor device in which a lower wiring and an upper wiring intersecting each other are formed on a front surface of a semiconductor substrate with a predetermined circuit formed thereon, comprising:

defining a substantially concave trench having a predetermined depth in an area for forming the lower wiring, which is placed on the front surface of the semiconductor substrate;

forming the lower wiring in a lower wiring forming area including an inside of said substantially concave trench;

forming a resist layer on the lower wiring to fill said substantially concave trench;

forming a substantially flat upper wiring on the front surface of the semiconductor substrate so as to pass over the resist layer formed on the lower wiring at an intersecting portion of the lower and upper wirings; and processing a back surface of the semiconductor substrate.

7. A method of manufacturing a semiconductor device in which a lower wiring and an upper wiring intersecting each other are formed on a front surface of a semiconductor substrate with a predetermined circuit formed thereon, comprising:

defining a substantially concave trench having a predetermined depth in an area for forming the lower wiring, which is placed on the front surface of the semiconductor substrate;

forming the lower wiring in a lower wiring forming area including an inside of said substantially concave trench;

forming a substantially flat upper wiring on the front surface of the semiconductor substrate so as to have a recessed shape within said substantially concave trench at an intersecting portion of the lower and upper wirings; and processing a back surface of the semiconductor substrate.

* * * * *